United States Patent [19]

England et al.

[11] Patent Number: 5,932,882
[45] Date of Patent: Aug. 3, 1999

[54] ION IMPLANTER WITH POST MASS SELECTION DECELERATION

[75] Inventors: Jonathan Gerald England, Horsham, United Kingdom; Babak Adibi, Santa Clara, Calif.; Mitchell C. Taylor, Lake Oswego, Oreg.

[73] Assignee: Applied Materials, Inc., Santa Clara, Calif.

[21] Appl. No.: 08/860,749

[22] PCT Filed: Nov. 8, 1996

[86] PCT No.: PCT/GB96/02741

§ 371 Date: Sep. 8, 1997

§ 102(e) Date: Sep. 8, 1997

[87] PCT Pub. No.: WO97/17717

PCT Pub. Date: May 15, 1997

[30] Foreign Application Priority Data

Nov. 8, 1995 [GB] United Kingdom .................... 9522883
Aug. 1, 1996 [GB] United Kingdom .................... 9616169

[51] Int. Cl.$^6$ .................................................. H01J 37/317
[52] U.S. Cl. ...................................... 250/492.21; 250/398
[58] Field of Search ............................ 250/492.21, 398, 250/396 R

[56] References Cited

U.S. PATENT DOCUMENTS

| 4,766,320 | 8/1988 | Naitoh et al. ......................... 250/492.2 |
| 4,782,304 | 11/1988 | Aitken .................................. 250/492.3 |
| 4,929,836 | 5/1990 | Parker et al. ......................... 250/492.3 |
| 5,780,863 | 7/1998 | Benveniste et al. ................ 250/492.21 |

FOREIGN PATENT DOCUMENTS

| 0451907 | 10/1991 | European Pat. Off. . |
| 0473097 | 3/1992 | European Pat. Off. . |
| 1279449 | 6/1972 | United Kingdom . |

OTHER PUBLICATIONS

S.N. Hong et al. "Formation of . . . a modified Ion Implanter", *Appl. Phys. Lett.* 53 (18), Oct. 31 1968 pp. 1741–1743.

A.H. Al–Bayati et al., "Performance of mass . . . materials research", *Rev.Sci Instrum.* 65(8), Aug. 1994 pp. 2680–2692.

Daniel F. Downey, "Low energy . . . and processing," *Nuclear Instruments & Method in Physics Research* B74 (1993 pp. 160–169.

*Primary Examiner*—Kiet T. Nguyen
*Attorney, Agent, or Firm*—Boult Wade Tennant

[57] ABSTRACT

A decel lens assembly (9) located between the mass selection flight tube and the substrate holder comprises a first electrode (65) at the substrate potential, a second electrode (60) at the flight tube potential and a field electrode (61) between the two at a negative potential to provide focusing. The axial spacing in the beam direction between the first and second electrodes is less than the smallest transverse dimension of the field electrode. The decel lens assembly (9) is mounted directly opposite the outlet from the process chamber to the vacuum pump to maximize evacuation efficiency. An additional screening electrode (56) is provided between the second electrode of the decel lens assembly and the exit aperture of the mass selector. A perforated screening cylinder (54) is mounted on the light tube with the second electrode of the lens assembly mounted at the down beam end of the cylinder. A first electrode has a cylindrical screening flange extending around the field electrode. A further screening electrode is located at the entrance to the electron confinement tube of the PFS system.

44 Claims, 4 Drawing Sheets

ION IMPLANTER WITH POST MASS SELECTION DECELERATION

FIELD OF THE INVENTION

This invention relates to ion implanters for implanting ions into substrates, such as semiconductor wafers, in electronic device fabrication, and in particular to ion implanters capable of processing wafers on a commercial scale with relatively low implant energies.

DESCRIPTION OF THE PRIOR ART

Ion implantation techniques are commonly used as one of the processes employed in the manufacture of integrated circuits, to modify the electrical transport properties in predefined regions of a semiconductor material by doping these regions with a predetermined concentration of impurity atoms. The technique generally involves generating a beam of a preselected specie of ions and directing the beam towards a target substrate. The depth of the ion implant depends, inter alia, on the energy of the ion beam at the substrate. As the density of devices on a single wafer increases and the lateral dimensions of individual devices decrease for ultra-large scale integrated circuits (ULSI), the ability of an ion implanter to form shallow junctions using low energy ions, e.g. of about 2 keV to 10 keV, becomes increasingly important. At the same time, in commercial ion implantation, it is also important to be able to process an individual wafer in as short a time as possible and this requires the ion beam current to be as large as possible. Unfortunately, the requirement of a low energy beam tends to conflict with the requirement of a high current beam, since it is extremely difficult to transport an ion beam at low energy and high current due to space charge effects.

A known scheme to avoid the problem of beam expansion and loss of beam current is to transport the ion beam at high energy and then decelerate the beam to the desired low energy just before the beam impacts the substrate. For example, Applied Physics Letters 53 (18) Oct. 31, 1988, pages 1741 to 1743, S. N. Hong et al describes a conventional ion implanter which has been modified in order to study implant depth profiles by incorporating into the implant chamber a decelerating lens system in which a fixed target substrate is held. A retarding power supply is connected between the retarding lens and the beam extraction power supply such that the final energy of the ions just prior to impacting the target is determined solely by the retarding potential generated by the retarding power supply. Ions are extracted from the ion source at an energy of 35 keV and are passed through an analyser magnet which analyses the ions transported in the beam according to their mass. The mass analysed beam is then passed to an X-Y scanner which deflects the beam from the path between the magnet and the scanner along another path directed at the target. The retarding lens and target, which are biased at 34 kV, decelerate the beam from 35 keV to the fixed implant energy of 1 keV. Thus, ions are transported at high energy along the path between the ion source and the implant chamber to minimize beam expansion due to space charge effects and consequential loss of current. The energy of the ion beam is then only reduced just in front of the target, before impact, so that the beam travels a very short distance at low energy, again to minimize beam expansion.

One problem with the method of transporting the ion beam at relatively high energy and then decelerating the ion beam very close to the target is that, along the passage of the high energy beam, a proportion of the beam ions are neutralized through charge exchange processes with residual gas atoms and become high energy neutrals which, if directed at the target, will pass through the retarding lens without being slowed. These high energy neutrals penetrate more deeply into the substrate than the low energy ions, which is particularly undesirable when forming shallow junctions. The effect of these high energy neutrals on the implant depth can be seen as a high energy tail in the depth profile as measured by secondary ion mass spectroscopy (SIMS).

Review of Scientific Instruments 65(8) August 1994, pages 2680 to 2692, A. H. Al-Bayati et al describes a mass analysed, low energy, dual ion beam system for materials research. The apparatus comprises a pair of Freeman sources each with associated extraction electrodes, an analysing magnet or mass analysing the ion beam, a further magnet for focusing the beam, electrostatic deflectors for scanning and gating the ion beam, an ultra-high vacuum (UHV) deposition chamber housing a retarding lens for reaching the energy of the ion beam and a target mounted within the lens. The apparatus is designed to allow materials to be deposited as well as implanted into the substrate and the ion arrival energy can be controlled from 5 eV to 10 keV. The dual ion source together with the mass analysing magnet allow alternate layers of different materials to be deposited. The ultra-high vacuum deposition chamber houses equipment for in-situ Auger electron spectroscopy and reflection high-energy electron diffraction analysis of the deposited material. A second UHV chamber, connected to the deposition chamber by means of a vacuum lock and sample transfer device, houses equipment for in-situ low energy electron diffraction and time of flight scattering and recoiling spectrometry. The deposition chamber is maintained at ultra-high vacuum in order to minimize contamination of the target surface during the deposition processes. After the beam has been mass-analysed, the second magnet refocuses the beam to a point several centimeters in front of the target. The ion beam is transported at an energy of 10 keV into the deposition chamber, where the energy of the beam is reduced to the desired value by the retardation lens. Thus, a proportion of the beam ions will be converted into 10 keV neutrals by charge exchange processes as the beam travels to the target. The number of neutrals which actually reach the target is reduced by the second magnet, which bends the ion beam off the beam trajectory from the first magnet so that neutrals generated between the first and second magnets do not reach the target. Neutral production is further reduced by maintaining the deposition chamber under ultra-high vacuum so that neutral production along the straight path between the second magnet and the target is minimal.

The retardation lens is configured as a cup with part of the lens being parallel to the beam axis and an end part normal to the beam axis in which the target is mounted. In practice, the retardation lens and target are maintained at ground potential and the flight tube is biased negatively with respect to ground. A further electrode is positioned at the entrance of the retardation lens and is slightly negatively biased with respect to the flight tube in order to prevent the retardation field extending back along the flight tube which would otherwise accelerate electrons into the retardation lens thereby causing loss of beam neutralization and a concomitant increase in the rate of beam divergence in the flight tube. The entrance aperture of the suppression electrode and the diameter of the cup electrode are both substantially larger than the beam diameter.

The maximum on-target ion current density achievable in this instrument is about 100 $\mu Acm^{-2}$, although the reported current densities are substantially lower. As the target chamber is maintained under UHV conditions, e.g. at pressures from $10^{-4}$–$10^{-8}$ Pa ($10^{-6}$ to $10^{-10}$ mbar), and the sources operate at pressures of 1 Pa ($10^{-2}$ mbar), differential pumping stages along the beam line are required, which increases the length of the beam line to almost 4 m. Further, there are no provisions for neutralising surface charge build-up as required for higher current implantation of semiconducting substrates.

Nuclear Instruments and Methods in Physics Research, B74 (1993), pages 160 to 169, D. F. Downey et al describes various methods of characterising an ion implanter's performance when implanting ions at low energy. As in the above references, the ion beam is initially transported at relatively high energy and subsequently decelerated to the desired implant energy. The particular implanters used each had a multi-electrode acceleration tube which was used to decelerate the ion beam in a stepped manner, so that the deceleration voltage was distributed over the length of the acceleration tube, rather than decelerating the beam to the required energy just in front of the target. Gradual deceleration of the ion beam along the acceleration tube is reported to improve beam transport by minimizing focusing effects of the tube, thereby optimizing the beam current. Such an arrangement is also reported to minimize neutral formation. In one investigation, the implant depth profile is studied as a function of beam extraction voltage to determine the extent to which neutrals affect the depth profile, for sets of ion implant energies of between 3 and 10 keV. A neutral peak was readily observed in the depth profile for the higher extraction voltages, indicating that neutral contamination is an important factor when determining the energy at which the ion beam should be transported before being decelerated to the required energy. The maximum achievable beam current for a 5 keV boron implant was of the order of 1 mA.

An object of the present invention is to provide an improved ion implanter capable of implanting ions at low energy and at beam current densitites which enable semiconductor wafers to be processed on a commercial scale.

An ion implanter capable of operating at low implant energies and with substantial beam currents is disclosed in our co-pending application filed on even date herewith and claiming priority from GB Application No. 9522883.9. In this arrangement a deceleration lens assembly is provided between the substrate holder and the flight tube through which the beam is transported at a transport energy normally above the desired implant energy. The deceleration lens assembly includes at least two, and normally three, electrodes with a first electrode held substantially at the substrate potential and an adjacent field electrode which is biased to be at a sufficient potential relative to the first electrode to produce a focusing field at the first electrode to counteract the tendency of beam ions to blow up under space charge effects whilst the beam is in the decelerating field. Typically, for positive beam ions, the field electrode is biased at a negative potential relative to the first electrode which is of sufficient magnitude so that the field electrode is also at a substantial negative potential relative to the flight tube potential. Thus, the field electrode also acts as an electron suppression electrode preventing electrons in the beam in the flight tube from being drawn out of the beam by the deceleration field. However, the potential on the field electrode is much greater (in the negative direction) than would be required merely for electron suppression purposes, so that the field electrode in combination with the first electrode at the substrate potential can provide the necessary focusing effect.

In tests with a beam decelerating implanter of the kind described above, the inventors have found that there can be problems with high energy contamination of the substrate, at energies above the transport energy of the beam through the flight tube. The inventors have discovered that this higher energy contamination results from beam ions being neutralised as they are temporarily accelerated by the field electrode before being decelerated between the field electrode and the first electrode at the substrate potential. An object of embodiments of the present invention is to reduce this higher energy contamination to negligible levels.

According to one aspect of the present invention, there is provided an ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, a second apertured plate electrode connected to be substantially at the flight tube potential and a field electrode having a beam aperture and located between and adjacent to each of said first and second apertured plate electrodes, a potential bias supply connected to bias said field electrode to have the same polarity relative to each of said first and second electrodes the electrodes being arranged and a said bias being such as to provide a focusing field for beam ions passing through said first electrode, said first and second electrodes being spaced apart in the beam direction by a distance less than the smallest transverse dimension of the beam aperture of the field electrode.

By keeping the distance in the beam direction between the first and second electrodes to a small value, the time during which beam ions are temporarily accelerated by the field electrode to an energy above the transport energy through the flight tube, is kept to a minimum. As a result, the probability of beam ions at this higher energy experiencing electron exchange collisions with residual gas ions is reduced and the number of higher energy neutrals formed in this region is also substantially reduced. In the invention as described above, beam ions are temporarily accelerated only in the short distance between a point a little upstream of the second electrode and the mid point of the field electrode, whereafter the beam ions are decelerated again. Because this distance is so short and the residence time of beam ions in this region is also short, high energy contamination is reduced.

In a preferred embodiment, the ion implanter further includes mass selection apparatus in the flight tube to select a desired mass of ions for transmission in the ion beam from the flight tube, said mass selection apparatus including an electromagnetic screen at the flight tube potential to screen the mass selection apparatus from electric fields generated downstream in the beam direction, said screen providing an exit aperture for said mass selected ion beam from the flight tube. Then, the implanter may include at least one additional mass selection apparatus screening electrode comprising an apertured plate at the flight tube potential located between said second electrode and said exit aperture.

This additional screening electrode prevents fields from the field electrode, which may penetrate through the aperture of said second electrode, from extending significantly beyond the position of this additional screening electrode.

This allows the distance between the field electrode and the mass selection apparatus to be kept to a minimum without electric fields penetrating the mass selection apparatus and disturbing the mass selection process. As a result, the flight time of beam ions at the transport energy from the mass selection apparatus towards the deceleration lens assembly is kept to a minimum so that the possibility of neutral contamination of the target at the transport energy is reduced. Also, by preventing the acceleration field produced by the field electrode from penetrating upstream along the beam, neutralising electrons can exist in the beam over a greater distance towards the field electrode so that the tendency of the beam to blow up through space charge effects is also reduced.

Preferably, the implanter includes a screening cylinder mounted on the flight tube at the flight tube potential and extending axially towards said field electrode to contain the ion beam, said second apertured plate electrode being mounted on the end of the screening cylinder adjacent to the field electrode and said screening cylinder being perforated to assist evacuation of the interior of the cylinder. Then, the apertured plate forming said additional screening electrode can be located in said screening cylinder.

In a preferred embodiment, the implanter includes neutralisation apparatus located between the substrate holder and said first electrode to provide a supply of low energy charged species of opposite polarity to the beam ions for neutralising surface charge build-up on the substrate during implantation. Then, the implanter preferably includes a neutralisation apparatus screening electrode comprising an apertured plate located between said first electrode and said neutralisation apparatus. In a preferred arrangement, the neutralisation apparatus includes an electron confinement tube surrounding the beam immediately in front of the substrate holder, whereupon the neutralisation apparatus screening electrode may be mounted directly on the upstream end of this electron confinement tube.

This construction is very important in permitting the field electrode to be located as close as possible to the substrate while still permitting the neutralisation apparatus to be located between the two. Because the neutralisation apparatus operates by providing a flood of low energy charged species, usually electrons for a positive ion beam, it is very important to prevent extraneous electric fields from penetrating into the neutralisation region. It has been found that the presence of the additional screening electrode permits the first electrode to be located very close to the upstream end of the electron confinement tube and for the confinement tube itself to be made relatively short whilst still providing adequate neutralisation of the substrate being implanted.

Preferably, said first apertured plate electrode has a cylindrical screening flange extending axially from the first electrode towards said field electrode and the field electrode is mounted inside the flange so that the flange surrounds the outer periphery of the field electrode. This construction minimises the tendency of electric field from the field electrode penetrating round the outside periphery of the first electrode towards the substrate holder and neutralisation apparatus.

In a further preferred embodiment, the implanter includes a process chamber containing said substrate holder and having an outlet port, and a vacuum pump connected to said outlet port for evacuating the process chamber, wherein said deceleration lens assembly is located directly in front of said outlet port to the vacuum pump. This is another feature which is very important in reducing neutral contamination at energies to which beam ions are temporarily accelerated as they pass the field electrode. By locating the deceleration lens assembly, where beam ions are temporarily accelerated, immediately in front of the outlet port to the vacuum pump, the residual gas pressure in this region of the deceleration lens assembly can be minimised, so that the probability of an electron exchange collision in this region is minimised.

An apertured plate electrode is an electrode comprising a plate extending transversely of the beam direction and containing an aperture for the beam, wherein the axial dimension (in the beam direction) of the aperture is insignificant compared to the smallest transverse dimension of the aperture.

BRIEF DESCRIPTION OF THE DRAWINGS

Examples of embodiments of the present invention will now be described with reference to the drawings in which.

DESCRIPTION OF PREFERRED EMBODIMENTS

Figure 1:
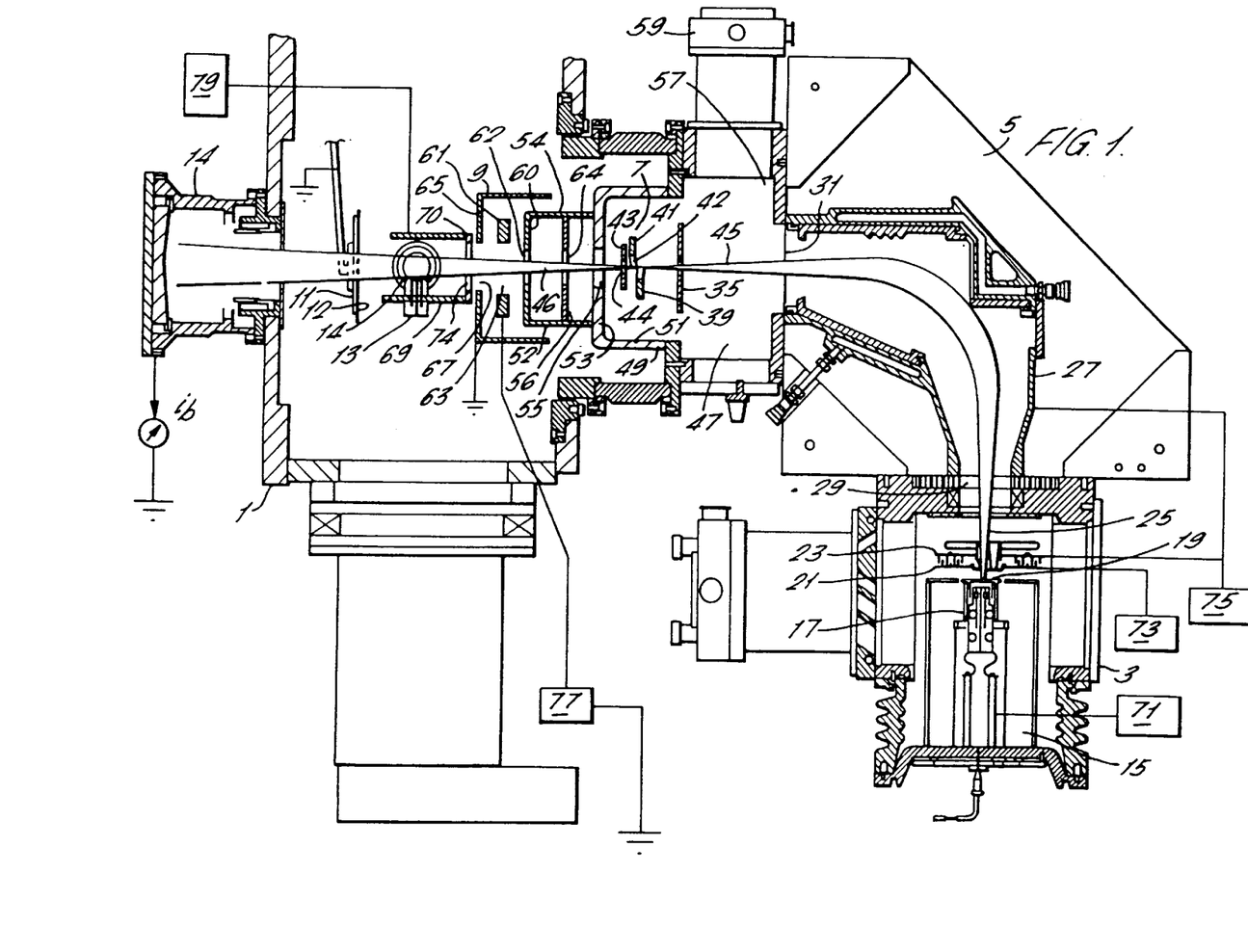
FIG. 1 shows a plan view of an ion implanter according to an embodiment of the present invention.

Referring to FIG. 1, an ion implanter 1 comprises an ion beam generator 3 for generating a beam of ions, a magnet 5 adjacent the ion beam generator for resolving spatially the beam ions according to their mass, an ion selector 7 disposed adjacent the analysing magnet 5 for selecting a specie of ions to be implanted into a target substrate and for rejecting other ions in the spatially resolved beam from the magnet, an electrode assembly 9 disposed adjacent the ion selector 7 for controlling the final energy of the ion beam before implantation, a support or holder 11 spaced from the electrode assembly 9 for supporting a target substrate 12 to be implanted with beam ions and an electron generator 13 disposed between the electrode assembly 9 and the substrate support 11 for introducing electrons into the ion beam near the target surface to neutralise the beam and wafer surface. An ion beam collector 14 is positioned downstream of the substrate support 11 which serves as a beam stop and ion current detector for dosimetry measurements.

In more detail, the ion beam generator 3 comprises an ion source 15 including an arc chamber 17 having an exit aperture 19 formed in the front face thereof. A pair of extraction electrodes 21,23 are spaced from the exit aperture 19 for extracting ions from the arc chamber and forming an ion beam 25. The extraction electrode 21 which is closest to the exit aperture 19 of the arc chamber serves as a suppression electrode to prevent electrons forward of the beam generator from flowing to the arc chamber. A flight tube 27 is positioned between two poles (only one shown) of the mass analysing magnet 5 for receiving the ion beam from the beam generator 3 and for controlling the transport energy of the ion beam during its passage between the poles of the magnet 5, which is determined by the potential difference between the flight tube 27 and the ion source 15. In this particular embodiment, the magnetic field strength of the analysing magnet and the energy of the ion beam through the magnet are chosen so that ions having an appropriate mass are deflected through approximately 90° and the flight tube 27 is configured accordingly, with the analysing magnet exit aperture 31 being approximately orthogonal to the magnet entrance aperture 29. The ion selector 7 comprises a series of discrete elements 35, 39, 41 and 43 which are spaced apart along the beamline 45 and define a series of apertures which, in combination, select ions of the correct mass to be implanted in the target substrate while rejecting other spatially resolved ions which pass through the analysing magnet 5. In this particular embodiment, the ion selector 7 comprises a plate electrode 35 which rejects most of the unwanted ion species exiting from the magnet, a pair of elements 39, 41, which together define a variable width mass resolving slit which passes only the selected ion specie, and a further element 43 which defines the height of the ion beam. However, the number of mass resolving elements and their configuration may be varied.

The ion selector assembly is housed in a chamber 47 which forms part of the flight tube 27 and which is disposed between the magnet and the electrode assembly 9. The flight tube 27 including the mass resolving chamber 47 provides the means by which the beam is transported from the ion beam generator to the electrode assembly 9. The mass resolving chamber wall 49 comprises a part 51 which extends in the direction of the beamline and defines a generally cylindrical envelope, and a transverse part 53 adjacent the cylindrical part 51 which constitutes a plate electrode disposed transverse to the beam line and defines an aperture 55 through which the beam can pass, the aperture 55 being adjacent the final element 43 of the ion selector 7. The transverse part 53 provides an electromagnetic screen for screening the ion selector 7 from electric fields originating downstream of the ion selector, as will be described in more detail below.

In this particular embodiment, a vacuum port 57 is formed in the chamber wall 49 near the analysing magnet 5 which is connected to a vacuum pump 59 for evacuating the chamber 47, although in another embodiment this vacuum port may be omitted.

A screening assembly 52 is positioned between the exit aperture 55 of the mass resolving chamber 47 and the electrode assembly 9 to reduce penetration of the electric field from the electrode assembly 9 into the mass resolving chamber 47 through the exit aperture 55. The screening assembly 52 comprises a cylindrical electrode 54, and a field defining electrode 56. The cylindrical electrode 54 is arranged coaxially with the exit aperture 55 of the mass resolving chamber and with one end 58 positioned adjacent and connected to the transverse part (or front end) 53 of the mass resolving chamber wall 49. The cylindrical electrode 54 extends forward of the mass resolving chamber 47 and may have an inwardly extending radial flange 60 formed near or at the other end of the cylindrical electrode 54 to provide additional screening, and defining an exit aperture 62.

The field defining electrode 56, which may or may not be used, comprises a circular plate with an aperture 64 formed in the centre thereof. The field defining electrode 56 is mounted within and supported by the cylindrical electrode 54 and is positioned about midway between the ends of the cylindrical electrode 54 (although this may vary) and transverse to beam line 45. The aperture 64 is preferably rectangular or square and, in one embodiment may taper gently outwards towards the electrode assembly 9. In this example, the aperture is square and has a width of about 60 mm. The cylindrical electrode 54 and the field defining electrode 56 may each be made of graphite or other suitable material.

The electrode assembly 9 for controlling the implant energy of the ion beam is situated just beyond the screening assembly 52, and comprises a field or ring electrode 61 and an apertured plate electrode 65. The field electrode 61, has a generally circular symmetry and defines an aperture 63 adjacent and substantially coaxial with the exit aperture 64 of the screening assembly 52. The plate electrode 65 is disposed generally transverse to the beamline 45 and defines a further aperture 67 through which the ion beam can pass, this further aperture 67 being disposed adjacent the field electrode aperture 63. The diameter of the field electrode and plate electrode apertures are about 90 mm and 80 mm, respectively, in this example. The field electrode and the plate electrode may each be made of graphite or other suitable material.

In this embodiment, the electron injector 13 comprises a plasma flood system which introduces low energy electrons into the ion beam near the target. The plasma flood system includes a guide or confinement tube 69 through which the ion beam can pass from the plate electrode aperture 67 to the target substrate 12, and which both maintains electrons from the plasma flood system in the vicinity of the ion beam and screens the portion of the ion beam between the plate electrode aperture and the wafer from stray electric fields. An apertured plate electrode 70 is positioned at the upstream end of the confinement tube, adjacent the apertured plate electrode of the deceleration assembly to provide additional screening of the interior of the confinement tube from electric fields from the field electrode 61.

The apertures 63 and 67 formed in the field electrode 61 and the plate electrode 65 are each made larger than the beam cross-sectional area at these apertures, so that the ion beam can pass straight through without clipping the electrodes 61, 65. For a given mass of ion and distance between each of these apertures 63,67 and the analysing magnet 5, the beam cross-sectional area will depend on such factors as the ion beam generator and magnet optics, the resolving power of the magnet and the width of the mass resolving slit, each of which can be used to control the beam cross-sectional area at the retardation apparatus and the target substrate.

In this embodiment, the ion implanter further comprises an ion source voltage supply 71 for biasing the ion source, a suppression electrode voltage supply 73 for biasing the suppression electrode 21, a flight tube voltage supply 75 for biasing the flight tube 27, the mass resolving chamber 47, the screening assembly 52, and the other extraction electrode 23, a field electrode voltage supply 77 for biasing the field electrode 61 of the electrode assembly 9, and a plasma flood voltage supply 79 for biasing the electron confining electrode 69 and the apertured screening plate electrode 70. In this embodiment, the apertured plate electrode 65 of the deceleration lens, the target substrate holder 11 and the substrate 12 are maintained at ground potential, which facilitates handling of the target substrate, simplifies the target support assembly, and serves as a convenient reference potential for the other electrodes.

A method of operating the ion implanter to implant ions at low energy will now be described with reference to a specific example for illustrative purposes only.

The ion implantation energy is determined by the potential difference between the substrate 12 and the ion source 15. As the substrate is maintained at ground potential, the ion source voltage supply 71 is biased positively with respect to ground by an amount which corresponds to the desired ion implantation energy. For example, for a 2 keV implant, the ion source voltage supply is biased to +2 kV. The transport energy of the ion beam through the analysing magnet 5 and the mass resolving chamber 47, which is also referred to as the extraction energy of the ion beam, is determined by the potential difference between the ion source 15 and the flight tube, which is controlled by the flight tube voltage supply 75. Thus, for example, to transport the ion beam at an energy of 10 keV through the flight tube, the flight tube is biased at −10 kV relative to the ion source or −8 kV relative to ground. The ion beam is transported with substantially constant energy through the analysing magnet and different ionic species within the ion beam are resolved spatially by the magnet according to their mass. The spatially resolved beam then passes into the mass resolving chamber, where the beam first passes through a predefining aperture defined by the plate electrode 35 closest to the analysing magnet 5. The plate electrode 35 acts as a course, first stage filter for the spatially resolved beam and blocks a proportion of the spatially resolved ion species which are not required in the implant. The second and third elements 39 and 41 spaced from the analysing magnet 5, and which are displaced axially from one another along the beamline, define a variable width mass resolving slit 42, whose position can be varied in a direction transverse to the beamline, for selecting from the filtered beam the ion species to be implanted.

As an example, in a boron implant the spatially resolved beam leaving the analysing magnet may contain $BF_3$, $BF_2$, BF, B and F ions and the molecular and boron ions will contain either isotope of boron, $B_{10}$ and $B_{11}$. Thus, for a boron-11 implant the predefining element 35 and the mass resolving elements 39, 41 will filter out all ionic species except $B_{11}$.

As the beam traverses the mass resolving chamber 47, the energy of the beam is maintained constant, in this example 10 keV. The 10 keV mass resolved beam 46 passes through the exit aperture 55 of the mass resolving chamber 47, through the screening assembly 52 to the electrode assembly 9.

A potential is applied to the field electrode 61 of magnitude less than that of the mass resolving chamber 47. The magnitude of the potential applied to the field electrode 61 is sufficient to establish an electrostatic focusing field in the region of the final aperture 67 of the grounded plate electrode 65. The inventors have found that a potential of between −5 kV and −30 kV and preferably −25 kV with respect to the potential of the plate electrode 65 is sufficient to establish the required focusing field at the final lens aperture 67 to maintain the beam ions within the beam between the final lens aperture 67 and the target substrate. As the flight tube and the mass resolving chamber are at −8 kV, the field electrode 61 is biased to a potential lower than the potential of the flight tube and serves to prevent electrons in the mass resolving region from being drawn to the plate electrode 65, which would destroy space charge neutralisation in this region and cause beam expansion and loss of current.

In the present example, as the mass resolved beam 46 approaches the field electrode 61, the beam is briefly accelerated above the transport (extraction) energy of 10 keV to an energy defined substantially by the potential difference between the ion source 15 and the field electrode 61. The beam passes through the field electrode aperture 63 and is then decelerated to substantially the required implant energy in the gap between the field electrode aperture 63 and the final aperture 67. At the same time, a net focusing force is applied to the ion beam in the region between the mass resolving chamber exit aperture 55 and the field electrode 61, and in the region between the field electrode 61 and the plate electrode 65 of the deceleration lens and just beyond.

The ion beam then passes into the region between the final lens aperture 67 and the target substrate. In this region, the ion beam is transported to the substrate at substantially the required implant energy. Expansion of the now, low velocity beam is minimised by flooding the beam with low energy electrons by means of the plasma flood system 13. The plasma flood system also minimises surface charging of the target substrate during ion implantation and simultaneously reduces the potential of the ion beam, again to minimise the extent to which the beam expands before reaching the substrate.

The retardation apparatus of the present invention represents a significant advance over prior art systems. Firstly, the present retardation apparatus allows the ion beam to be neutralised after the beam has been decelerated, which is not possible in the prior art systems. The difficulty of space charge neutralising the ion beam at the target by using some system of introducing electrons into the beam arises because, as ions are being decelerated in a retardation field, the retardation field accelerates electrons away from the beam ions, so that the electron injector is substantially ineffective. In the case of a plasma flood system, in which the ion beam is neutralised by low energy electrons contained in a stable plasma, the intense electric fields present in a retardation lens would prevent such a plasma from being formed. In the present arrangement, the plasma flood system is arranged downstream of and is screened from the retardation apparatus, so that the plasma flood system is not exposed to the intense retardation fields. This allows the critical conditions for forming the required low energy plasma to be established and maintained.

Secondly, loss of space charge neutralisation is inevitable as the ion beam travels through the intense retardation field. Accordingly, in the prior art arrangements, the retardation lens is placed as close to the target as possible so that the beam travels a minimum distance without space charge neutralisation. In contrast, in the present arrangement, the retardation apparatus is set back upstream from the target substrate, between the neutralising apparatus and mass resolving chamber, and is arranged to apply a focusing force to the ion beam during retardation to oppose beam expansion in this region where space charge neutralisation of the ion beam is considerably depleted. It has been found that by making the final lens aperture 67 of the retardation electrode 65 at least 15% larger than the beam cross-sectional area at the final aperture, and applying a sufficiently high potential difference between the field electrode 61 and the plate electrode 65 in a direction which decelerates the ion beam in the region between these electrodes, surprisingly high current densities can be achieved at the target substrate. For example, on-target ion current densities of 70 and 250 $\mu Acm^{-2}$ have been achieved for low energy beams of 2 keV and 10 keV, respectively, and on-target ion current densities of 5.0 and 20.0 $\mu Acm^{-2}$ have been achieved for ultra-low energy (<1 keV) beams of 200 eV and 500 eV, respectively.

The aperture 63 of the field electrode 61 is also larger than the beam cross-sectional area thereat and is capable of transmitting all the beam current. In constant along the beamline and the depth of the aperture in the direction of the beamline is relatively small.

The aperture 64 of the field defining electrode 56 and the exit aperture 55 of the mass resolving chamber are also sized larger than the beam cross-sectional area thereat, so that all the beam current transmitted by the mass resolving slit 42 and the beam height defining aperture 44 enters the retardation zone. Thus, beyond the beam height defining aperture 44, all the apertures through which the beam passes to the substrate are larger than the beam cross-section at a respective aperture so that all the beam current from the beam height defining element 43 can be transmitted to the substrate. This is a significant departure from prior art arrangements, in which the size of apertures along the beamline are restricted in order, for example, to define the width and shape of the beam at the target, to provide an impedance to gas flow through the aperture so that a differential pressure across the aperture can be maintained or to enable the inner face of the aperture to be as close to the ion beam as possible so that a lower potential can be applied to the electrodes.

We define the ratio of the cross-sectional area of the beam at a given aperture to the area of the aperture as the 'filling factor'. It is preferred that the filling factor of the focusing electrode 61 and the lens plate electrode 65 is less than 85% for all species of dopant ions. It has been found that filling factors of less than about 85% allow higher beam current densities to be transported along the beamline. It is believed that providing a reasonable gap between the beam and the various beamline electrodes reduces beam expansion due to space charge effects, since the electric field generated by an electrode transverse to the beamline causes less disturbance to the ions and electrons transported at the periphery of the ion beam than if the inner face of the electrode aperture is close to the ion beam. Thus, by ensuring that the size of the apertures of the electrodes downstream of the mass resolving slit are all larger than the beam cross-section thereat, beam expansion can be reduced and the beam current density increased. Furthermore, sizing the apertures larger than the beam cross-section prevents the beam ions from striking the electrodes, thereby substantially reducing contamination of the beam by graphite, metallic or other materials which would otherwise be sputtered from the surface of the electrodes.

The inventors have found that there can be problems with energy contamination of the decelerated low energy ion beam at energies above the transport energy and that such contamination results from neutralisation of the beam ions as they are temporarily accelerated by the field electrode before being decelerated in the region between the field electrode and lens plate electrode.

Figure 2:
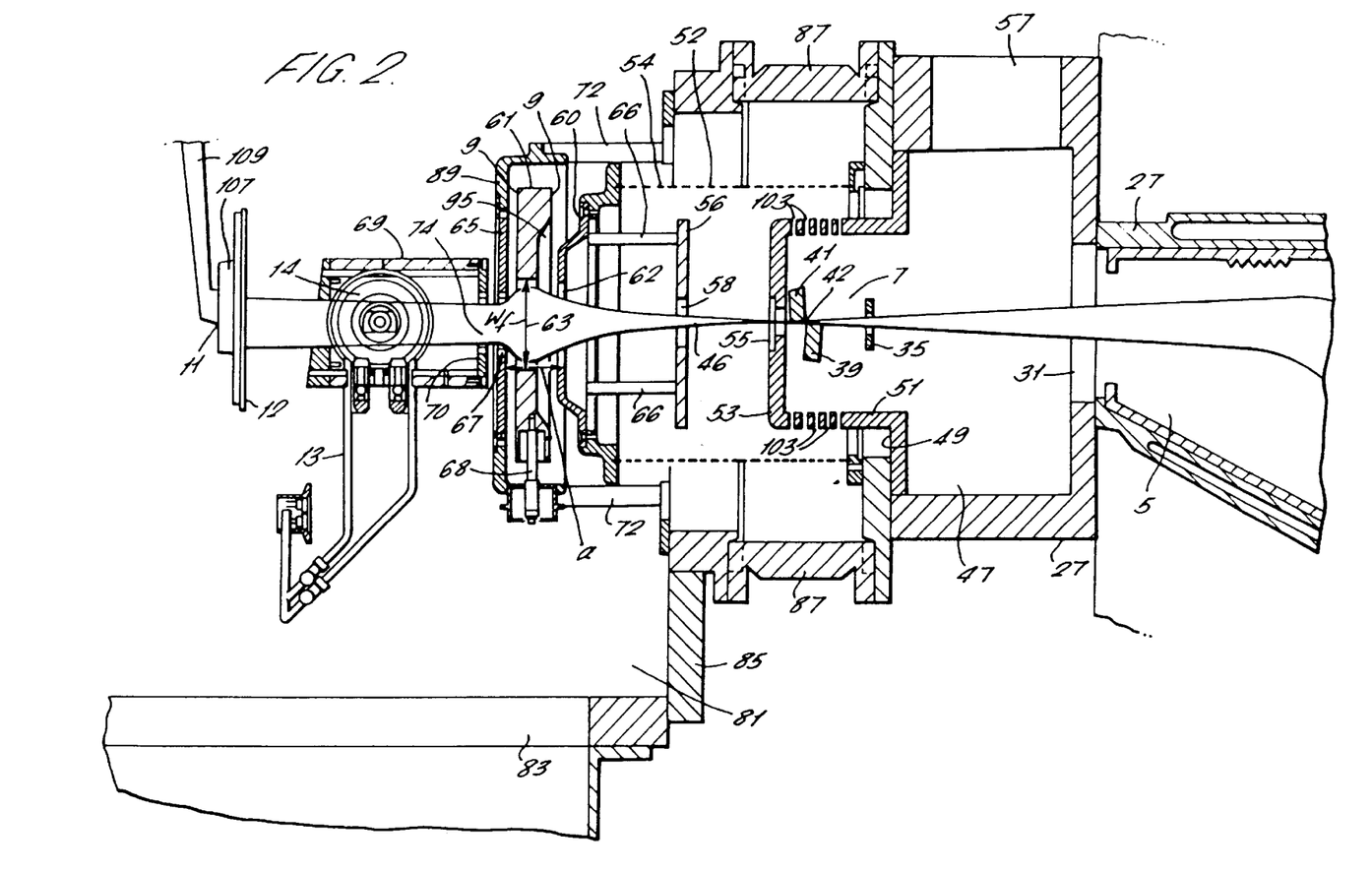
FIG. 2 shows a plan view of an ion implanter according to a preferred embodiment.

FIG. 2 shows a plan view of a preferred embodiment of a beam transport apparatus for low energy ion implantation which substantially eliminates such high energy contamination of the ion beam. In FIG. 2, the ion beam generator, most of the mass analysing magnet and the beam stop of the ion implanter have been omitted for clarity, but these may be the same as those described above and shown in FIG. 1. Referring to FIG. 2, the apparatus comprises a flight tube 27 including a mass resolving chamber 47 housing an ion selector 7 for selecting the desired implant ions from the mass analysed beam from the magnet 5, a deceleration lens assembly 9 downstream of the mass resolving chamber 47 for decelerating the ion beam, a beam neutralising apparatus downstream of and adjacent to the deceleration lens assembly, and a target substrate holder 11 downstream of and adjacent to the beam neutralising apparatus 13.

The ion selector 7 comprises a plate electrode 35 which rejects most of the unwanted ion species from the magnet and a pair of elements 39,41, which together defines a variable width mass resolving slit 42 which passes only the selected ion specie. The mass resolving chamber wall 49 comprises a part 51 which extends in the direction of the beam line and defines a generally cylindrical envelope, and a front end portion 53 which constitutes a plate electrode extending transverse to the beam line. The front end portion 53 defines an aperture 55 through which the ion beam can pass and which is adjacent the mass resolving slit defining elements 39 and 41.

Referring to FIGS. 2 to 5, the deceleration lens assembly comprises a first apertured plate electrode 65 for controlling the implant energy and positioned adjacent the beam neutralising apparatus 13, a second apertured plate electrode 60 located upstream of the first apertured electrode 65, and a field electrode 61 located between and adjacent to the first and second apertured plate electrodes 65,60 for providing a focusing field for beam ions passing through the first apertured plate electrode 65. An additional apertured plate electrode 56 is located upstream of the second apertured plate electrode 60 to provide further screening of the ion selector 7 from electric fields generated downstream of the ion selector 7 and in particular from fields originating at the field electrode 61. In this particular embodiment, the additional screening electrode 56 is mounted on stand-offs 66 extending rearwardly from the second apertured electrode 60.

Figure 3:
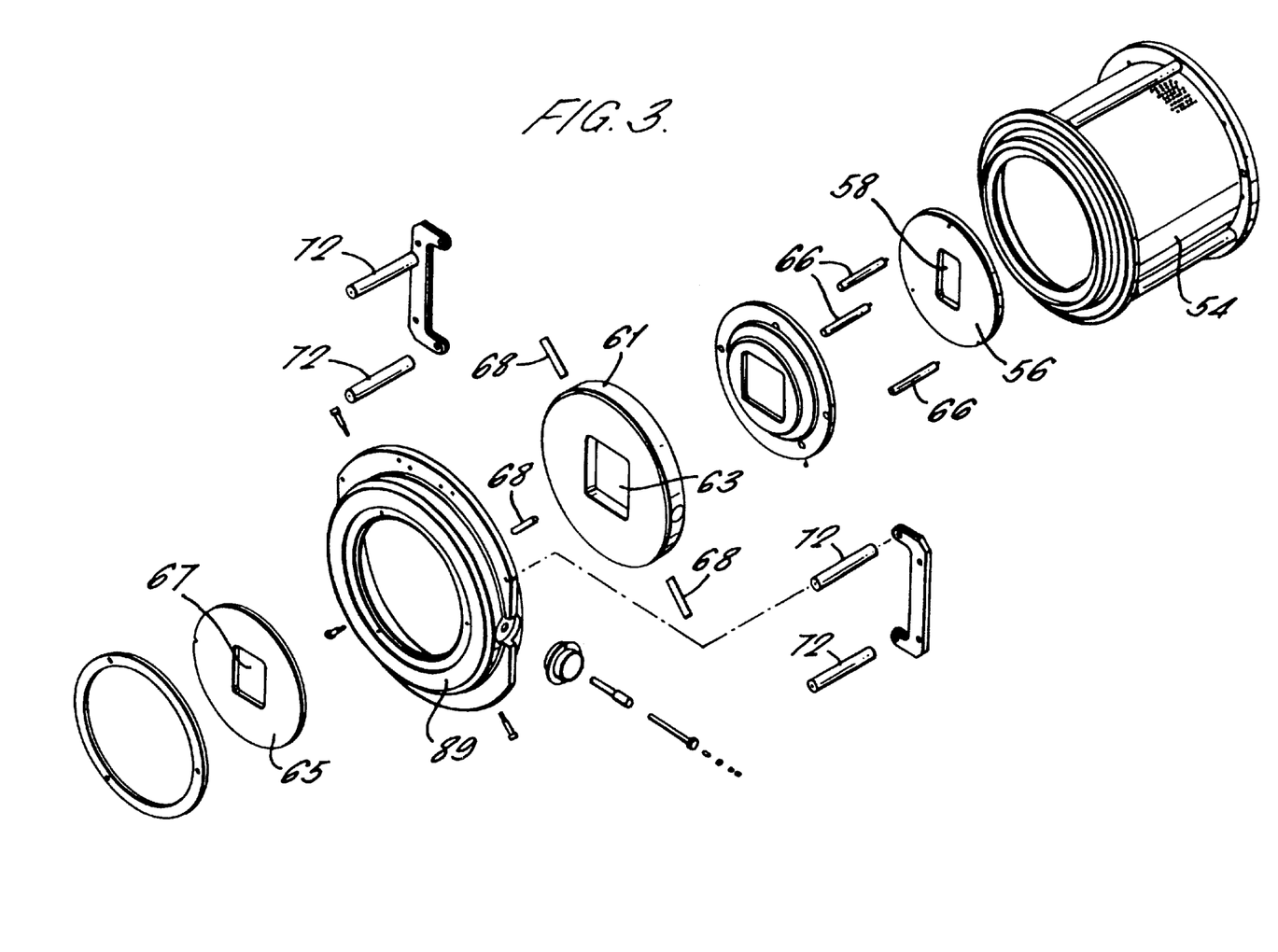
FIG. 3 shows an exploded view of the deceleration lens assembly and lens screening apparatus of the embodiment shown in FIG. 2.

A screening cylinder 54 is mounted on the flight tube 27 and extends axially towards the field electrode 61. The second apertured plate electrode 60 is mounted on the forward end of the screening cylinder 54 and the screening cylinder 54 encloses the additional screening electrode 56. In this embodiment, the screening cylinder 54, the second apertured plate electrode 60 and the additional apertured plate electrode 56 are all electrically connected to the flight tube 27.

Returning to the deceleration lens assembly, the beam apertures formed in both the field electrode 61 and the first apertured electrode 65 are rectangular and in each case the width $w_f$ and $w_d$ of the aperture is shorter than the height $h_f$ and $h_d$. The aperture formed in the first apertured electrode 65 is smaller than that of the field electrode 61 in both height and width to provide enhanced screening of the beam neutralising apparatus 13 from the electric field originating at the field electrode 61. In one embodiment, the beam aperture 63 of the field electrode has dimensions of about 86×100 mm and the beam aperture 67 of the first apertured plate electrode has dimensions of about 60×86 mm.

Figure 4:
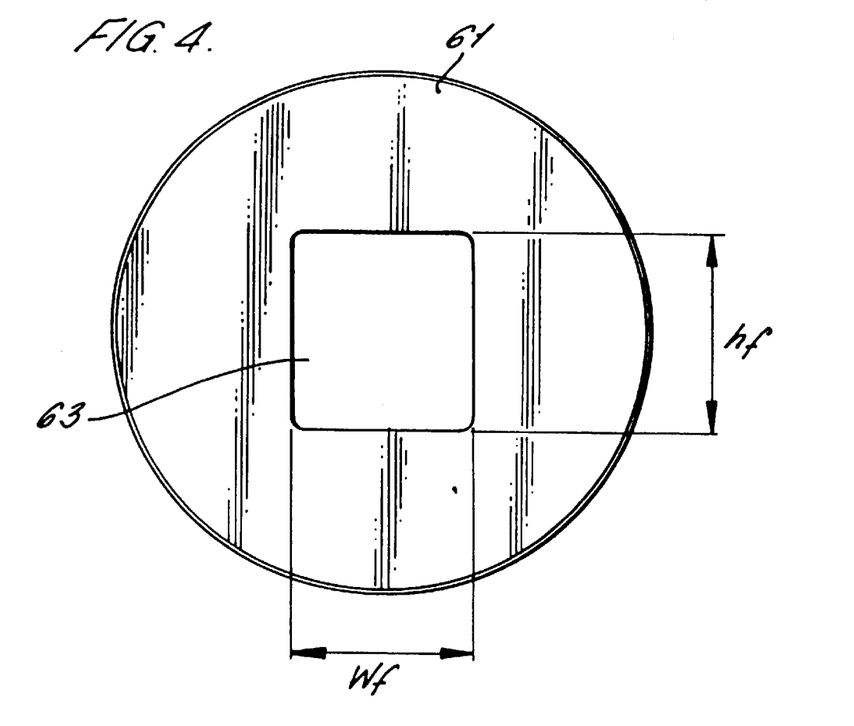
FIG. 4 shows a front view of the field electrode shown in FIGS. 2 and 3.
Figure 5:
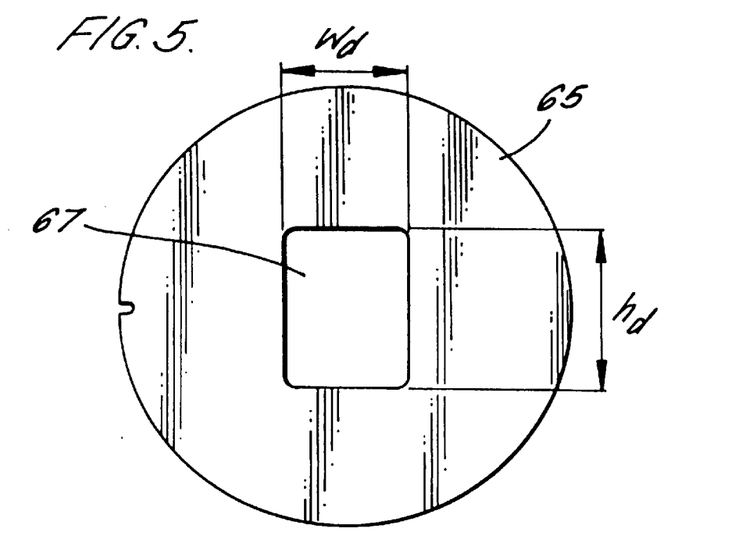
FIG. 5 shows a front view of the first apertured plate electrode shown in FIGS. 2 and 3.

The fractional reduction in the aperture width between the field electrode and first apertured plate electrode 65 is greater than the fractional reduction in aperture height between the field and first apertured electrode. In this embodiment, as the ion beam passes through the mass resolving slit, the beam has a pencil-like cross-sectional geometry so that the beam tends to expand laterally at a faster rate than it does vertically due to space charge effects. The larger reduction between the widths of the apertures intensifies the focusing force in the lateral direction across the width of the ion beam to counteract the higher expansion rate in this direction. The beam aperture configuration of the first apertured plate electrode 65 and the field electrode 61 increases the focusing capacity of the deceleration lens so that the potential of the field electrode relative to the first and second apertured electrodes necessary to provide adequate focusing of the beam can be reduced, thereby reducing the energy briefly attained by the ion beam above the transport energy on passing through the field electrode aperture. This in turn reduces the energy of fast neutrals created in this region by charge exchange with residual gas atoms.

Referring to FIG. 2, the first and second apertured plate electrodes 65 and 60 are spaced apart in the beam direction by a distance 'a' of less than the smallest transverse dimension '$w_f$' (in this case the width) of the beam aperture of the field electrode 61. This is another important feature of the preferred deceleration lens assembly. The short distance between the first and second apertured plate electrodes 65,60 ensures that the time that ions have an energy above the transport energy as they are accelerated by the field electrode 61 is kept to a minimum. Consequently, the probability of beam ions at these higher energies experiencing charge exchange collisions with residual gas atoms is reduced with a concomitant reduction in the number of high energy neutrals formed in this region.

The field electrode 61 is generally cylindrical and has an axial length in the beam direction of at least 10% of the smallest transverse dimension of the beam aperture (in this case the aperture width). In this particular embodiment, the axial length is about 23% of the aperture width. This configuration enhances the focusing effect whilst permitting the aperture of the field electrode 61 to be larger than the expanded beam width as it passes through the field electrode.

A cylindrical flange 89 extends axially from the first apertured plate electrode 65 towards the field electrode 61. The cylindrical flange 89 and the first apertured plate electrode 65 form a shield around the ion beam and the field electrode 61, to confine the electric field established by the potential difference applied between the field electrode 61 and the first apertured plate electrode 65, thereby preventing charged particles near the target substrate 12 from flowing upstream to the field electrode 61, and at the same time screening the ion beam from any stray electric fields present in the process chamber 81, which might otherwise upset the charge balance in the ion beam causing loss of beam current.

The field electrode 61 is located inside the flange 89 so that the flange surrounds the outer periphery of the field electrode 61. In this embodiment, the field electrode 61 is mounted in and supported by the cylindrical screening flange 89 via a plurality of stand-offs 68 which are positioned radially around the periphery of the field electrode 61. The field electrode and first apertured plate electrode assembly is mounted on the process chamber wall 85 by a plurality of stand-offs 72. In this embodiment, the cylindrical screening flange 89 extends a minimal distance beyond the rearward face of the field electrode 61 so that the gap 95 between the field electrode and the second apertured plate electrode is easily accessible and communicates directly with the surrounding space within the process chamber 81. This open geometry enables the region between the field electrode 61 and the second apertured plate electrode 60 to be evacuated more easily so that the residual gas pressure in this region can be reduced to minimise the production of fast neutrals which would otherwise cause high energy contamination.

A vacuum port 83 is formed in the wall of the process chamber 81 to allow the process chamber to be evacuated. The opening of the vacuum port is relatively large and extends parallel to the beam line in the region of the target substrate to collect particles sputtered from the target during implantation. The deceleration lens assembly, in particular the region between the field electrode 61 and the second apertured plate electrode 60, is located directly in front of the vacuum outlet port 83 of the process chamber 81 so that the interior of the lens can be evacuated more efficiently, which assists further in minimising the production of fast neutrals and high energy contamination of the ion beam.

Thus, the deceleration lens assembly shown in FIG. 2 is configured and constructed so as to allow the space within the lens to be evacuated effectively so as to minimise the residual gas pressure in the interior of the lens and the production of neutrals in this region above the implant energy and in particular above the flight tube transport energy.

In this embodiment, the beam neutralising apparatus 13 comprises a plasma flood system comprising a plasma source 14 which injects electrons into the ion beam near the surface of the target substrate. The plasma flood system includes an electron confinement tube 69 which surrounds the ion beam and is located immediately in front of the target holder 11. A screening electrode 70 for screening the plasma flood system from electric fields originating at the deceleration lens assembly is mounted on the upstream end of the confinement tube 69 and is located adjacent the first apertured plate electrode 65. This construction permits the lens assembly 9 to be located as closely as possible to the target substrate 12 while still permitting the neutralisation apparatus 13 to be located between the two. The additional screening electrode 70 has a beam aperture 74 of approximately the same size as the beam aperture 67 in the first apertured plate electrode 65 and substantially prevents extraneous electric fields from penetrating into the neutralisation region. The additional screening electrode 70 permits the first apertured electrode 65 to be located very close to the upstream end of the electron confinement tube 69 and for the confinement tube 69 itself to be made relatively short whilst still providing adequate neutralisation of the substrate 12 being implanted.

FIG. 2 also shows an example of how the beam width profile changes along the beam line as the beam passes from the analysing magnet 5 through the deceleration lens assembly to the target substrate 12. The magnet optics bring the ion beam to a narrow focus at the mass resolving slit 42 defined by the mass resolving elements 39,41. As the ion beam passes through the mass resolving slit 42, and through the beam apertures 55 and 58 of the mass resolving chamber 47 and additional screening plate electrode 56, the beam width gradually expands. As the beam approaches the beam aperture 62 of the second apertured plate electrode 60, the electric field between the field electrode 61 and the second apertured plate electrode 60 initially applies a focusing force to the ion beam which reduces the rate of expansion and subsequently applies a defocusing force to the ion beam, as the beam approaches the field electrode 61 and is briefly accelerated above the transport energy. However, the electric field between the field electrode 61 and the second apertured plate electrode 60 applies a net focusing force since the ion beam has a lower velocity and therefore spends more time experiencing the focusing force in the region nearer the beam aperture of the second apertured plate electrode 60.

As the ion beam passes through the field electrode 61 into the gap between the field electrode 61 and the first apertured plate electrode 65, the beam is decelerated to the desired implant energy and the electric field between these electrodes applies a strong focusing force to the ion beam so that the beam width narrows to pass through the beam aperture 67 of the first apertured plate electrode 65.

Finally, the ion beam passes into the electron confinement tube 69 of the neutralising apparatus 13 via the beam aperture 74 of the screening plate electrode 70 to the target with negligible divergence of the beam width.

Another important aspect of the present invention is that the ion implanter is arranged so that the path length between the mass analysing magnet and the retardation apparatus can be made much shorter than prior art implanters. As mentioned above, this not only allows the implanter to be more compact, but also reduces the production of fast neutrals which cause energy contamination of a low energy ion beam. Essentially, fast neutrals which could impinge upon the target are produced anywhere upstream of the retardation electrode having a direct line of sight to the target. Neutrals which are produced in the region between the first apertured plate electrode of the deceleration lens and the target will have an energy equivalent to or less than the implant energy and therefore will not cause high energy contamination. To shorten the critical path length in which fast neutrals could be formed, the flight tube downstream of the analysing magnet is made as short as possible by including only a mass resolving assembly between the magnet and the deceleration lens assembly. The unique deceleration lens assembly allows the distance between the first apertured plate electrode and the end of the mass resolving assembly to be as short as possible by virtue of its extremely simple construction. In the embodiments shown in FIGS. 1 and 2, the first apertured plate electrode 65 which controls the final energy of the ion beam is placed as close as possible to the exit aperture 55 of the mass resolving chamber 47. The deceleration apparatus comprises only one further electrode, namely the field electrode 61, placed between the first apertured plate electrode 65 and the end 53 of the mass resolving chamber 47 to control the shape of the beam in the retardation region and through the final aperture 67 of the lens assembly to achieve substantially 100% transmission of the beam current to the target substrate, given that the apertures of both the field electrode 61 and the final aperture 67 are both larger than the beam cross-section thereat.

It has been found necessary to include a finite gap between the field electrode 61 and the end 53 of the mass resolving chamber 47 in which to incorporate some screening means extending along the beamline, in order to reduce penetration of the electric field from the focusing electrode 61 through the mass resolving chamber exit aperture 55 to an acceptable level. Essentially, it is not possible to provide sufficient screening by reducing the size of the exit aperture 55 alone without the edge of exit aperture 55 clipping the beam. Sufficient screening of the electric field without beam clipping can only be obtained by including a shield around the ion beam which extends over a finite length of the beamline between the field electrode 61 and the end of the mass resolving chamber. In the embodiments shown in FIGS. 1 and 2, the screening means comprises a hollow cylindrical electrode 54 which is effectively an extension of the flight tube and an additional apertured plate electrode 56. For a given size of mass resolving chamber exit aperture 55, the screening length is preferably made as short as possible. It has been found that the screen length provided by a cylindrical shield alone can be shortened considerably by placing an additional apertured plate electrode 56 between the field electrode 61 and the front end 53 of the mass resolving chamber. Reducing the screening length not only contributes to the shortening of the overall beam path length between the magnet and the first apertured plate electrode of the deceleration lens, but also minimises the distance over which ions are momentarily accelerated to energies above the extraction energy, thereby mitigating energy contamination in this critical region.

Another advantage of reducing the path length of the ion beam between the magnet and the first apertured plate electrode of the deceleration lens assembly is that at the first apertured plate electrode, the beam width due to space charge expansion will be less than for a longer path length. In other words, for a shorter path length, a larger beam expansion can be tolerated. This feature gives rise to a significant benefit in enabling the ion beam to be transported at a lower energy, so that the difference between the implant energy and the transport energy can be reduced. Thus, the ion implanter can be controlled so that any neutrals generated upstream of the first apertured plate electrode have energies only slightly greater than the implantation energy and therefore only penetrate into the target substrate slightly deeper than the implant ions. Furthermore, reducing the beam path length between the ion beam generator and the target substrate decreases the number of neutralisation interactions, so that less ion current is lost in creating neutrals. In the embodiments shown in FIGS. 1 and 2, the length of the implanter from the magnet to the end of the process chamber is about 2 m, the distance between the magnet exit aperture 31 and the target substrate 12 is approximately 90 cm, and the distance between the magnet exit aperture 31 and the first apertured plate electrode 65 is approximately 60 cm. High energy neutrals which could cause energy contamination of the ion beam at the substrate may also be formed in the region upstream of the exit aperture 31 of the analysing magnet 5. Advantageously, the length of this region having a direct line of sight to the substrate, may be shortened by increasing the magnetic field strength of the analysing magnet to bend the ion beam into a tighter arc. The compact beamline arrangement, including the retardation apparatus, between the analysing magnet and the target substrate enables the magnet arc radius to be substantially decreased, and in the embodiments shown in FIGS. 1 and 2, the radius is 23 cm. Advantageously, this allows the whole of the beam path length from the ion beam generator to the substrate to be shortened, thereby further decreasing the size of beam cross-section at the substrate and reducing loss of beam current from the ion beam generator to the target.

The ion implanter may also be used such that the final implant energy is greater than the energy at which the beam is transported through the analysing magnet (referred to as acceleration mode). In this case, with reference to FIG. 1 or 2, the ion beam is transported at a predetermined energy through the mass analysing magnet 5 and the mass resolving chamber 47, and is then accelerated to the final implant energy using the electrode assembly 9. For example, for an implant energy of 80 keV, the ion source potential is set at 80 kV with respect to the first apertured plate electrode 65 and target substrate 11, which are both at ground. The extraction electrode 23, the flight tube and screening apparatus up to and including the second apertured plate electrode 60 are all set to a potential relative to the potential of the ion source which determines the transport energy of the ion beam along the flight tube. For example, for an extraction energy of 30 keV, the potential of the flight tube relative to ground is set at +50 kV. As for the case where the implant energy is lower than the extraction energy (referred to as decel or retardation mode), the field electrode 61 is again biassed at a potential lower than the first apertured plate electrode 65 in order to establish a gentle focusing field in the region of the final aperture 67 of the lens assembly, to concentrate the ion beam in this region. For example, the field electrode 61 may be biassed at −25 kV relative to the first apertured plate electrode. As the ion beam passes through the mass resolving chamber exit aperture 55, the beam is firstly accelerated by the field between the field electrode 61 and the end 53 of the mass resolving chamber 47, to an energy greater than the implant energy and is then decelerated in the region between the cylindrical electrode 61 and the plate electrode 65 to the final implant energy of 80 keV. It has been found that both high and low energy beams can be successfully transmitted to the substrate by operating the ion implanter in accel and decel mode respectively, without substantially changing potential difference applied between the first apertured plate electrode 65 and the cylindrical electrode 61. Thus, advantageously, once the potential difference between these electrodes is set, no further adjustment of the potential difference is required, which simplifies switching between low energy and high energy implants.

In order to transport a beam of ions successfully, the pressure of the gas through which the beam passes must be high enough to supply a sufficient number of electrons to neutralise the beam. The electrons are generated as the ion beam interacts with the residual gas atoms and are trapped in the potential well formed by the electrostatic charge of the positive ions. A gas pressure of between $10^{-3}$ and $10^{-2}$ Pa ($10$–$5$–$10^{-4}$ mbar) is commonly used in most commercial ion implanters. However, the present retardation electrode arrangement allows the residual gas pressure within the retardation region to be pumped to lower pressures, as the apertures formed in both the first apertured plate and field electrodes can be substantially larger than the beam cross-section. Thus, gas within the retardation region can be pumped through the apertures at a higher rate, resulting in a lower gas pressure in this region. Furthermore, as the field electrode is the only other electrode required in addition to the first apertured plate electrode to decelerate and transmit the ion beam to a remote target, the electrode assembly is extremely simple and can easily be configured as an open structure which may be efficiently evacuated. The advantage of reducing the residual gas pressure in the retardation zone is that the number of interactions between beam ions and residual gas atoms is reduced, so that less ion current is lost and fewer neutrals are produced resulting in less energy contamination of the ion beam. It has been found that the residual gas pressure can be decreased by about an order of magnitude or more, i.e., to at least $10^{-6}$ mbar, without a significant increase in the rate of beam divergence. However, a decrease in pressure of at least an order of magnitude does result in a corresponding decrease of at least an order of magnitude of energy contamination. Advantageously, the focusing action of the retardation apparatus tends to compensate for any increase in the rate of beam divergence in this region, so allowing the gas pressure to be reduced.

Referring again to FIG. 2, the deceleration lens assembly 9, the plasma flood system 13 and the target substrate support 11 are all housed within a process chamber 81 which is positioned adjacent the mass resolving chamber 47 and communicates with the mass resolving chamber through an aperture 55 formed in the front end section 53 of the mass resolving chamber. The screening cylinder 52 between the front end wall 53 of the mass resolving chamber 47 and the second apertured plate electrode 60 screens the ion beam from stray electric fields in the process chamber 81 and is perforated so that this part of the beam line can be efficiently evacuated. A vacuum outlet port 83 is formed in the wall 85 of the process chamber 81 and is connected to a vacuum pump 86 (shown in FIG. 1). The vacuum pump is preferably a cryogenic pump capable of pumping at a rate of about 10,000 liters per second. The mass resolving chamber wall 49 is electrically insulated from the process chamber wall by an electrically insulating member 87 which forms part of the wall of the process chamber 81.

The mass resolving chamber 47, constitutes part of the critical path length between the analysing magnet 5 and the first apertured plate electrode 65 in which fast neutrals can be generated which may cause energy contamination of the ion beam. Although a finite residual gas pressure is required within the mass resolving chamber to provide space charge neutralisation of the ion beam, there is a substantial range of pressures over which the ion beam is sufficiently well neutralised to allow the pressure to be reduced to decrease the number of fast neutrals generated in this region. An important advantage in making the critical path length as short as possible is that a higher rate of expansion of the ion beam can be tolerated so that good space charge neutralisation is less important. An aspect of the present invention exploits this higher tolerance of beam expansion created by the shortened critical path length by reducing the pressure in the mass resolving chamber. Although a vacuum outlet port 57 is formed in the wall 49 of the mass resolving chamber 47 and is connected to a vacuum pump 59 (shown in FIG. 1), the size of the outlet port 57 and therefore the throughput is limited by the length of the mass resolving chamber, which ideally should be as short as possible. Although the mass resolving chamber communicates with the process chamber 81 through the exit aperture 55 formed in the end part 53, so that, at least to some extent, the mass resolving chamber can be evacuated through this aperture via the process chamber 81, the size of this aperture is limited as it must not allow significant penetration of the electric field originating at the field electrode 61 into the mass resolving chamber 47. To enable the pressure within the mass resolving chamber 47 to be substantially reduced below that which was previously possible, a plurality of further apertures 103 are formed in the dividing wall 51 between the mass resolving chamber 47 and the process chamber 81 to provide additional outlets through which the mass resolving chamber can be evacuated through the process chamber vacuum port(s) 83 by the process chamber vacuum pump(s) 86. In this embodiment, the apertures are formed in the part of the mass resolving chamber wall which extends generally in the direction of the beam line, although in other embodiments the further apertures may be formed in ohter parts of the wall, including those which extend transverse of the beam line. The size and spacing of the apertures is carefully chosen to preserve the screening of the ion beam provided by the dividing wall 51 and so that the ion beam is not disturbed by the discontinuity of the equipotential surface at the dividing wall, which could cause loss of beam current. In one embodiment, the apertures are formed as elongate slots, but may be square, rectangular, circular or rhombic or any other suitable shape.

The combination of the relatively large apertures of the deceleration lens assembly and the further apertures formed between the mass resolving chamber and the process chamber enable the critical beam path length between the analysing magnet and the retardation electrode 65 to be pumped to much lower pressures than has been previously possible, and advantageously, this has been achieved without additional vacuum pumps or increasing the length of the mass resolving chamber to accommodate a larger vacuum port. In fact, the additional outlet apertures between the mass resolving chamber 47 and the process chamber 81 may provide a throughput such that a separate mass resolving chamber vacuum pump is not required, simplifying the implanter and saving cost. Furthermore, the short beam path length allows the total volume which is to be evacuated to be substantially reduced.

One embodiment of the present invention includes a wafer support assembly comprising a plurality of individual support plates supported by and positioned around a rotatable hub via a plurality of radially extending spokes. FIG. 2 shows one such support plate 107 connected to a spoke 109, with the support plate 107 supporting a target substrate, for example a semiconductor wafer 12. The wafer support assembly can be moved in a direction transverse to the beamline so that the wafer can be scanned across the beam.

A further significant advantage of the present arrangement is that the focusing action of the retardation apparatus can be used to decrease the processing time of a single wafer, thereby increasing the wafer throughput of the ion implanter. For a low energy ion beam, i.e., typically below 10 keV, the beam width at the target substrate can be reduced to below that of a high energy beam, e.g., 20 keV, since there is no longer a requirement to use relatively wide beams to avoid energy density problems such as excessive charging and heating of the target wafer. The focusing action of the retardation apparatus can be used to reduce the on-target beam width which allows a reduction in the distance through which the spinning wafer support assembly must be scanned so that the wafers are uniformly doped by the ion beam. This enables the processing time for a given batch of wafers to be decreased so increasing the throughput of the implant machine.

In other embodiments of the ion implanter, any one or more of the apertured plate and field electrodes or screening electrodes in the process chamber may have at least one further aperture formed therein to provide additional outlets through which any enclosed volume can be pumped to achieve even lower pressures. The electrode may include an array of such apertures and may comprise a mesh. The dividing wall between the mass resolving chamber and the process chamber may also comprise a mesh, to enable even lower pressures within the mass resolving chamber to be achieved. Importantly, the mesh should be sized to provide adequate screening of the ion beam.

In other embodiments, the first apertured plate or electrode and the focusing or field electrode may have any suitable shape and configuration and each may comprise one or more individual electrodes. For example, the retardation electrode may include a cylindrical or ring electrode. In another embodiment, the retardation electrode and the plasma flood guide tube may comprise a single electrode or be electrically connected together. In another embodiment, the retardation electrode may be arranged so that it can be biassed to a potential different from that of the target substrate.

In another embodiment, the focusing or field electrode may comprise an extension of the flight tube and be substantially at the flight tube potential. In this embodiment, the potential difference between the flight tube and the first apertured plate or retardation electrode should be sufficient to apply a focusing force to the ion beam in the retardation zone. An additional electrode upstream of the retardation electrode and within the flight tube and biassed at a potential lower than that of the flight tube should be provided to prevent electrons being lost to the retardation electrode.

Modifications to the embodiments described above be apparent to those skilled in the art.

We claim:

1. An ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, a second apertured plate electrode connected to be substantially at the flight tube potential and a field electrode having a beam aperture and located between and adjacent to each of said first and second apertured plate electrodes, a potential bias supply connected to bias said field electrode to have the same polarity relative to each of said first and second electrodes the electrodes being arranged and said bias being such as to provide a focusing field for beam ions passing through said first electrode, said first and second electrodes being spaced apart in the beam direction by a distance less than the smallest transverse dimension of the beam aperture of the field electrode.

2. An ion implanter as claimed in claim 1, and further including mass selection apparatus in the flight tube to select a desired mass of ions for transmission in the ion beam from the flight tube, said mass selection apparatus including an electromagnetic screen at the flight tube potential to screen the mass selection apparatus from electric fields generated downstream in the beam direction, said screen providing an exit aperture for said mass selected ion beam from the flight tube.

3. An ion implanter as claimed in claim 2, and including at least one additional mass selection apparatus screening electrode comprising an apertured plate at the flight tube potential located between said second electrode and said exit aperture.

4. An ion implanter as claimed in claim 3, and including a screening cylinder mounted on the flight tube at the flight tube potential and extending axially towards said field electrode to contain the ion beam, said second apertured plate electrode being mounted on the end of the screening cylinder adjacent to the field electrode and said screening cylinder being perforated to assist evacuation of the interior of the cylinder.

5. An ion implanter as claimed in claim 4 wherein the apertured plate forming said additional screening electrode is located in said screening cylinder.

6. An ion implanter as claimed in claim 1 and including neutralisation apparatus located between the substrate holder and said first electrode to provide a supply of low energy charged species opposite polarity to the beam ions for neutralising surface charge build-up on the substrate during implantation.

7. An ion implanter as claimed in claim 6 and including a neutralisation apparatus screen electrode comprising an apertured plate located between said first electrode and said neutralisation apparatus.

8. An ion implanter as claimed in claim 6, wherein said first apertured plate electrode has a cylindrical screening flange extending axially from the first electrode towards said field electrode and the field electrode is mounted inside the flange so that the flange surrounds the outer periphery of the field electrode.

9. An ion implanter as claimed in claim 1, and including a process chamber containing said substrate holder and having an outlet port, and a vacuum pump connected to said outlet port for evacuating the process chamber, wherein said deceleration lens assembly is located directly in front of said outlet port to the vacuum pump.

10. An ion implanter as claimed in claim 1, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

11. An ion implanter as claimed in claim 1, wherein for at least one direction normal to the beam direction the beam aperture of the first electrode is smaller than the beam aperture of said field electrode.

12. An ion implanter as claimed in claim 1, wherein said potential bias supply is arranged to provide a bias such that said field electrode is at a negative potential of more than 5 kV relative to the flight tube.

13. An ion implanter as claimed in claim 1, wherein said field electrode is cylindrical with its axis in the beam direction and has a length at least 10% of the smallest transverse dimension of the cylinder.

14. An ion implanter as claimed in claim 1, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

15. An ion implanter for implanting ions into a substrate, comprising an ion beam generator for producing a beam of ions, a flight tube to transport said beam at a transport energy, a process chamber having an outlet port, a vacuum pump connected to said outlet port for evacuating the process chamber, a substrate holder in the process chamber for holding a substrate to be implanted with beam ions, a deceleration potential generator connected to apply a deceleration potential between the flight tube and the substrate holder to decelerate ions to a desired implant energy, a deceleration lens assembly located between the flight tube and the substrate holder and comprising a first apertured plate electrode connected to be substantially at the substrate potential and a field electrode located adjacent and upstream in the beam direction relative to said first electrode, and a potential bias supply connected to bias said field electrode relative to said first electrode, said electrodes being arranged and said bias being such as to provide a focusing field for beam ions passing through said first electrode, wherein said deceleration lens assembly is located directly in front of said outlet port to the vacuum pump.

16. An ion implanter as claimed in claim 15, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

17. An ion implanter as claimed in claim 15, wherein for at least one direction normal to the beam direction the beam aperture of the first electrode is smaller than the beam aperture of said field electrode.

18. An ion implanter as claimed in claim 15, wherein said potential bias supply is arranged to provide a bias such that said field electrode is at a negative potential of more than 5 kV relative to the flight tube.

19. An ion implanter as claimed in claim 15, wherein said field electrode is cylindrical with its axis in the beam direction and has a length at least 10% of the smallest transverse dimension of the cylinder.

20. An ion implanter as claimed in claim 15, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

21. An ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, and a field electrode located adjacent and upstream in the beam direction relative to said first electrode, a potential bias supply connected to bias said field electrode relative to said first electrode, said electrodes being arranged and said bias being such as to provide a focusing field for beam ions passing through said first electrode, said deceleration lens assembly further including a second apertured plate electrode connected to be substantially at the flight tube potential and located adjacent and upstream in the beam direction relative to said field electrode, mass selection apparatus in the flight tube to select a desired mass of ions for transmission in the ion beam from the flight tube, said mass selection apparatus including an electromagnetic screen at the flight tube potential to screen the mass selection apparatus from electric fields generated downstream in the beam direction, said screen providing an exit aperture for said mass selected ion beam from the flight tube, and at least one additional mass selection apparatus screening electrode comprising an apertured plate at the flight tube potential located between said second electrode and said exit aperture.

22. An ion implanter as claimed in claim 21, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

23. An ion implanter as claimed in claim 21, wherein for at least one direction normal to the beam direction the beam aperture of the first electrode is smaller than the beam aperture of said field electrode.

24. An ion implanter as claimed in claim 21, wherein said potential bias supply is arranged to provide a bias such that said field electrode is at a negative potential of more than 5 kV relative to the flight tube.

25. An ion implanter as claimed in claim 21, wherein said field electrode is cylindrical with its axis in the beam direction and has a length at least 10% of the smallest transverse dimension of the cylinder.

26. An ion implanter as claimed in claim 21, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

27. An ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, and a field electrode located adjacent and upstream in the beam direction relative to said first electrode, a potential bias supply connected to bias said field electrode relative to said first electrode, said electrodes being arranged and said bias being such as to provide a focusing field for beam ions passing through said first electrode, said deceleration lens assembly further including a second apertured plate electrode connected to be substantially at the flight tube potential and located adjacent and upstream in the beam direction relative to said field electrode, mass selection apparatus in the flight tube to select a desired mass of ions for transmission in the ion beam from the flight tube, said mass selection apparatus including an electromagnetic screen at the flight tube potential to screen the mass selection apparatus from electric fields generated downstream in the beam direction, said screen providing an exit aperture for said mass selected ion beam from the flight tube, and a screening cylinder mounted on the flight tube at the flight tube potential and extending axially towards said field electrode to contain the ion beam, said second apertured plate electrode being mounted on the end of the screening cylinder adjacent to the field electrode and said screening cylinder being perforated to assist evacuation of the interior of the cylinder.

28. An ion implanter as claimed in claim 27, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

29. An ion implanter as claimed in claim 27, wherein for at least one direction normal to the beam direction the beam aperture of the first electrode is smaller than the beam aperture of said field electrode.

30. An ion implanter as claimed in claim 27, wherein said potential bias supply is arranged to provide a bias such that said field electrode is at a negative potential of more than 5 kV relative to the flight tube.

31. An ion implanter as claimed in claim 27, wherein said field electrode is cylindrical with its axis in the beam direction and has a length at least 10% of the smallest transverse dimension of the cylinder.

32. An ion implanter as claimed in claim 27, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

33. An ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, and a field electrode located adjacent and upstream in the beam direction relative to said first electrode, a potential bias supply connected to bias said field electrode relative to said first electrode, said electrodes being arranged and said bias being such as to provide a focusing field for beam ions passing through said first electrode, and neutralisation apparatus located between the substrate holder and said first electrode to provide a supply of low energy charged species of opposite polarity to the beam ions for neutralising surface charge build-up on the substrate during implantation, wherein said first apertured plate electrode has a cylindrical screening flange extending axially from the first electrode towards said field electrode and the field electrode is mounted inside the flange so that the flange surrounds the outer periphery of the field electrode.

34. An ion implanter as claimed in claim 33, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

35. An ion implanter as claimed in claim 33, wherein for at least one direction normal to the beam direction the beam aperture of the first electrode is smaller than the beam aperture of said field electrode.

36. An ion implanter as claimed in claim 33, wherein said potential bias supply is arranged to provide a bias such that said field electrode is at a negative potential of more than 5 kV relative to the flight tube.

37. An ion implanter as claimed in claim 33, wherein said field electrode is cylindrical with its axis in the beam direction and has a length at least 10% of the smallest transverse dimension of the cylinder.

38. An ion implanter as claimed in claim 33, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

39. An ion implanter for implanting ions into a substrate, comprising an ion beam generator for producing a beam of ions, a flight tube to transport said beam at a transport energy, a substrate holder for holding a substrate to be implanted with beam ions, a deceleration potential generator connected to apply a deceleration potential between the flight tube and the substrate holder to decelerate beam ions to a desired implant energy, a deceleration lens assembly located between the flight tube and the substrate holder and comprising a first apertured plate electrode connected to be substantially at the substrate potential, and a field electrode located adjacent and upstream in the beam direction relative to said first electrode, a potential bias supply connected to bias said field electrode relative to said first electrode, said electrodes being arranged and said bias being such as to provide a focusing field for beam ions passing through said first electrode, neutralisation apparatus located between the substrate holder and said first electrode to provide a supply of low energy charged species of opposite polarity to the beam ions for neutralising surface charge build-up on the substrate during implantation, and a neutralisation apparatus screening electrode comprising an apertured plate located between said first electrode and said neutralisation apparatus.

40. An ion implanter as claimed in claim 39, and including a beam defining aperture located between said field electrode and said ion beam generator which is effective to define the width of the beam in at least one direction normal to the beam direction as the beam passes through the field electrode and said first electrode, wherein said field electrode has an aperture larger in said one direction than the width of the beam in said one direction as the beam passes through said field electrode and said first electrode has an aperture which is sufficiently larger in said one direction than the width of the beam in said one direction as the beam passes through said first electrode that beam ions avoid high radial field components at the periphery of the aperture of the first electrode which would tend to deflect ions out of the beam.

41. An ion implanter as claimed in claim 39, wherein for at least one direction normal to the beam direction the beam aperture of the first electrode is smaller than the beam aperture of said field electrode.

42. An ion implanter as claimed in claim 39, wherein said potential bias supply is arranged to provide a bias such that said field electrode is at a negative potential of more than 5 kV relative to the flight tube.

43. An ion implanter as claimed in claim 39, wherein said field electrode is cylindrical with its axis in the beam direction and has a length at least 10% of the smallest transverse dimension of the cylinder.

44. An ion implanter as claimed in claim 39, and including a magnet for resolving spatially the beam ions according to their mass, a process chamber containing said substrate holder and having an outlet port, a first vacuum pump connected to said outlet port for evacuating the process chamber, a mass selection chamber between said process chamber and said magnet, a second vacuum pump connected to evacuate said mass selection chamber, an aperture for the beam to pass from the mass selection chamber to the process chamber and at least one further aperture between said mass selection chamber and said process chamber to improve evacuation of one or the other of said chambers.

* * * * *